US012580580B2

(12) United States Patent
Young

(10) Patent No.: US 12,580,580 B2
(45) Date of Patent: Mar. 17, 2026

(54) ANALOG-TO-DIGITAL CONVERTER FOR SIGNAL SAMPLING

(71) Applicant: SEMICONDUCTOR COMPONENTS INDUSTRIES, LLC, Scottsdale, AZ (US)

(72) Inventor: Brian Young, Noblesville, IN (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 293 days.

(21) Appl. No.: 18/447,630

(22) Filed: Aug. 10, 2023

(65) Prior Publication Data

US 2025/0055470 A1     Feb. 13, 2025

(51) Int. Cl.
*H03M 1/46* (2006.01)
*H04N 25/78* (2023.01)

(52) U.S. Cl.
CPC ............ *H03M 1/466* (2013.01); *H04N 25/78* (2023.01)

(58) Field of Classification Search
None
See application file for complete search history.

(56) References Cited

U.S. PATENT DOCUMENTS

2011/0254569 A1* 10/2011 Bogner ................. G01R 15/06
                                                            324/679
2016/0150173 A1* 5/2016 Johansson ............ H04N 25/618
                                                            348/308
2016/0356718 A1 12/2016 Yoon et al.
2021/0376850 A1* 12/2021 Mudegowdar ........ H03M 1/001

OTHER PUBLICATIONS

Chen, Y. et al., "Column-Parallel Digital Correlated Multiple Sampling for Low-Noise CMOS Image Sensors," IEEE Sensors Journal, vol. 12, No. 4, Apr. 2012.
Kamoshita, S. et al., "A Proposal of Analog Correlated Multiple Sampling with High Density Capacitors for Low Noise CMOS Image Sensors," IS&T International Symposium on Electronic Imaging 2021, Imaging Sensors and Systems.
Kim, M. et al, "A Fast Multiple Sampling Method for Low-Noise CMOS Image Sensors With Column-Parallel 12-bit SAR ADCs", Retrieved from the Internet: URL:http://www.mdpi.com/journal/sensors; Sensors 2016, 16, 27; Received: Nov. 17, 2015 / Revised: Dec. 14, 2015 / Accepted: Dec. 22, 2015 / Published: Dec. 26, 2015.

* cited by examiner

*Primary Examiner* — Mark T Monk

(57) ABSTRACT

A system may include an analog-to-digital converter (ADC) that contains a capacitive digital-to-analog converter (CDAC). An input signal for the ADC may be sampled at different times using multi-sampling circuitry. The multi-sampling circuitry may include sampling capacitors that form at least part of the CDAC.

20 Claims, 6 Drawing Sheets

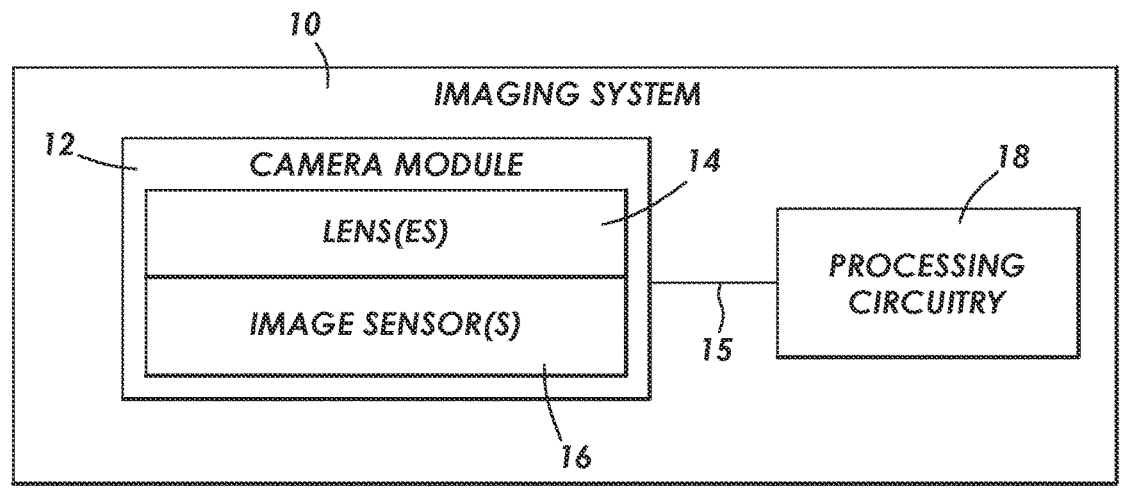
*F*IG.1
*F*IG.2

$V_{samp}$ [8]

$V_{samp}$ [7]

$V_{samp}$ [6]

$V_{samp}$ [5]

$V_{samp}$ [4]

$V_{samp}$ [3]

$V_{samp}$ [2]

$V_{samp}$ [1]

TIME t0

ANALOG-TO-DIGITAL CONVERTER FOR SIGNAL SAMPLING

BACKGROUND

This relates generally to systems with analog-to-digital converters (ADCs), and more specifically, to ADCs in image sensors or imaging systems.

Image sensors are commonly used in electronic systems or devices to generate image data. In a typical arrangement, an image sensor includes an image sensor array having active image sensor pixels. Based on control signals received along control paths, the active image sensor pixels generate image signals in response to incident light. The generated image signals are read out along readout paths and are used to generate one or more image frames usable in the electronic system.

The pixel-generated image signals are analog signals that are converted to digital data by ADCs during readout operations. To mitigate some types of noise such as random telegraph signal (RTS) noise, an image sensor can perform correlated multi-sampling (CMS) to sample a signal at multiple points in time and average the samples to reduce undesired effects or artifacts caused by the noise. Because the multiple samples are typically averaged in the digital domain, performing CMS can reduce frame rate due to the additional ADC conversions needed for the multiple samples.

BRIEF DESCRIPTION OF THE DRAWINGS

FIG. 1 is a diagram of an illustrative system having one or more image sensors in accordance with some embodiments.

FIG. 2 is a diagram of illustrative image sensor circuitry in accordance with some embodiments.

DETAILED DESCRIPTION

Figure 3:
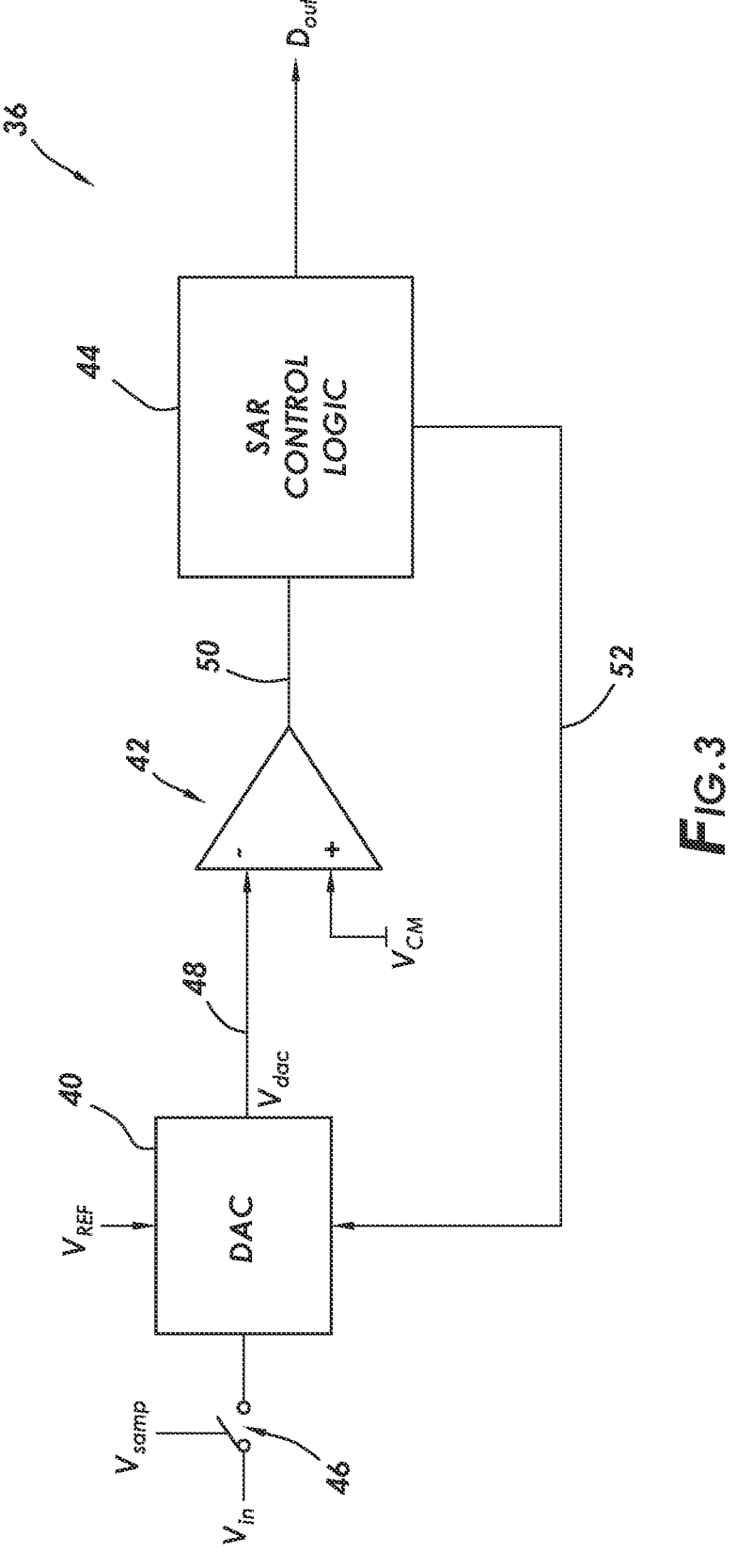
FIG. 3 is a diagram of illustrative analog-to-digital converter circuitry in accordance with some embodiments.

Electronic systems and/or devices may include one or more image sensors that gather incoming light to capture images. The image sensor may include one or more arrays of image sensor pixels. The pixels in the image sensor may include photosensitive elements such as photodiodes that convert the incoming light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the image pixels and readout circuitry for reading out image signals corresponding to the electric charge generated by the photosensitive elements.

FIG. 1 is a functional block diagram of an illustrative imaging system such as an electronic device that uses an image sensor to capture images. Imaging system 10 of FIG. 1 may be a portable electronic device such as a camera, a cellular telephone, a tablet computer, a webcam, a video camera, a video surveillance system, an automotive imaging system, a video gaming system with imaging capabilities, an augmented reality and/or virtual reality system, an unmanned aerial vehicle system such as a drone, an industrial system, or any other desired imaging system or device that captures image data.

Camera module 12, sometimes referred to as an imaging module, may be used to convert incoming light into digital image data. Camera module 12 may include one or more lenses 14 and one or more image sensors 16. When capturing images, light from a scene may be focused onto each image sensor 16 by one or more lenses 14. Image sensor 16 may include circuitry for converting analog pixel image signals into corresponding digital image data that is provided to storage and processing circuitry 18 via path 15. Path 15 may include a wired communication path containing conductive signal traces, vias, wires, or other conductive structures, and/or may include a wireless communication path implemented using wireless communication circuitry.

Storage and processing circuitry 18 may include one or more integrated circuits, each serving data storage functions and/or data computation or processing functions. As examples, the one or more integrated circuits may include image processing circuits such as digital signal processors, application-specific integrated circuits, general-purpose processors, microprocessors, microcontrollers, storage devices such as random-access memory and non-volatile memory, and/or other types of integrated circuits having processors and/or memories.

Storage and processing circuitry 18 may be implemented using components that are separate from the camera module and/or components that form part of the camera module. As one example, storage and processing circuitry 18 may be implemented using circuits that form part of an integrated circuit that includes an image sensor 16 or an integrated circuit within camera module 12. When storage and processing circuitry 18 is included on different integrated circuits than those of image sensors 16, the integrated circuits with storage and processing circuitry 18 may be vertically stacked or packaged with respect to the integrated circuits with image sensors 16.

Image data that has been captured by camera module 12 may be processed and stored using processing circuitry 18. As examples, an image processing engine on processing circuitry 18, an imaging mode selection engine on processing circuitry 18, and/or other types of processing engines on processing circuitry 18 may process the image data captured by camera module 12. Processing circuitry 18 may, if desired, provide processed image data to external equipment such as a computer, an external display, or other devices using wired and/or wireless communication paths.

As shown in FIG. 2, image sensor 16 may include a pixel array such as pixel array 20 containing image sensor pixels 22, which are sometimes referred to herein as image pixels or pixels, arranged in rows and columns. A row of pixels or a column of pixels may sometimes be referred to herein generally as a line of pixels. Image sensor 16 may include control and processing circuitry 24, sometimes referred to herein as control circuitry 24, that controls the operation of pixel array 20. Pixel array 20 may contain, for example, hundreds or thousands of rows and columns of image sensor pixels 22. If desired, pixel array 20 may be provided with a filter array having multiple visible color or non-visible filter elements each corresponding to a respective pixel, thereby allowing a single image sensor to sample light of different colors or sets of wavelengths.

Image sensor pixels 22 may be formed in a semiconductor substrate using complementary metal-oxide-semiconductor (CMOS) technology or charge-coupled device (CCD) technology or any other suitable photosensitive device technology. Image sensor pixels 22 may be frontside illumination (FSI) image sensor pixels or backside illumination (BSI) image sensor pixels.

Control circuitry 24 may be coupled to pixel control circuitry such as row control circuitry 26 which includes row drivers that provide control signals to pixel array 20 and may be coupled to pixel readout circuitry such as column readout and control circuitry 28 that read out signals from pixel array 20.

Row control circuitry 26 may receive row addresses and/or signals indicative of row addresses from control circuitry 24 and supply corresponding row control signals such as reset, anti-blooming, row-select, charge transfer, dual conversion gain, and readout control signals to pixels 22 over conductive lines or paths 30 such as pixel row control paths. In particular, each pixel row may receive different control signals over a corresponding number of control paths such that each pixel row is coupled to multiple conductive paths 30. One or more conductive lines or paths 32 such as pixel column readout paths may be coupled to each column of pixels 22. Conductive paths 32 may be used for reading out image signals from pixels 22 and for supplying bias signals such as bias currents or bias voltages to pixels 22. As an example, when performing a pixel readout operation, a pixel row in pixel array 20 may be selected using row control circuitry 26 and image signals generated by the selected image pixels 22 in that pixel row can be read out along conductive paths 32.

Column readout circuitry 28 may receive image signals such as analog pixel values generated by pixels 22 over conductive paths 32. Column readout circuitry 28 may include memory or buffer circuitry for temporarily storing calibration signals such as reset level signals, reference level signals, and/or other non-image signals read out from array 20 and for temporarily storing image level signals read out from array 20, amplifier circuitry or a multiplier circuit such as amplifier circuitry 34 provided on a per-column basis, analog-to-digital converter (ADC) circuitry such as ADC circuitry 36 provided on a per-column basis, bias circuitry, latch circuitry for selectively enabling or disabling portions of column readout circuitry 28, or other circuitry that is coupled to one or more columns of pixels in array 20 for operating pixels 22 and/or for reading out image signals from pixels 22.

While amplifier circuitry 34 and ADC circuitry 36 are shown as being external to readout circuitry 28 in the example of FIG. 2, this is merely illustrative. Amplifier circuitry 34 and ADC circuitry 36 may form part of readout circuitry 28. If desired, amplifier circuitry 34 may be omitted and/or other amplifier circuitry may be placed elsewhere in readout circuitry 28 such as downstream from ADC circuitry 36. In the example of FIG. 2, one or more amplifiers of amplifier circuitry 34 may be configured to receive an analog image signal from image pixel array 20 and to amplify the analog image signal. The analog image signal may include data from a single column of pixels 22 or amplifier circuitry 34 may receive analog image signals from multiple columns of pixels 22, depending on the application and the configuration of image sensor 16. ADC circuitry 36 may receive the (amplified) analog image signal and may perform an analog-to-digital conversion operation on the analog image signal to generate digital image data (sometimes referred to as digital pixel values or digital pixel data). The digital image data may be transmitted to (other portions of) column control and readout circuitry 28 for processing operations and/or readout operations. Readout circuitry 28 may supply the (processed) digital pixel data from pixels 22 in one or more pixel columns to control and processing circuitry 24 and/or processor 18 (FIG. 1) for further processing and/or storage.

FIG. 3 is a schematic diagram of illustrative analog-to-digital converter (ADC) circuitry 36 (sometimes referred to herein as analog-to-digital converter 36) configured to convert analog input signal Vin into digital output data Dout. As an example, an analog-to-digital converter may be included in an image sensor such as image sensor 16 of FIG. 2 or generally in imaging system 10 of FIG. 1. While described herein in the context of an image sensor and/or imaging system, an ADC may be implemented in any other suitable device or system. In the illustrative example of an imaging system, ADC 36 may receive analog signals from image pixel array 20 (FIG. 2). ADC 36 may receive an analog image signal as input analog signal Vin. Input signal Vin may be an analog signal from and/or generated by one or more pixels 22 in image pixel array 22 such as a signal received over a column line 32. ADC 36 may convert input analog image signal Vin to digital image data Dout, which may be provided to downstream readout and/or processing circuitry such as other portions of readout circuitry 28.

In the example of FIG. 3, ADC 36 may be a successive approximation register (SAR) ADC (sometimes referred to as a successive approximation ADC). SAR ADC 36 may use a binary search algorithm that is implemented using digital-to-analog converter (DAC) 40, comparator 42, and successive approximation register (SAR) control logic 44 in ADC 36 to perform the analog-to-digital conversion. Configurations in which a binary-based search or approximation configuration is implemented by SAR ADC 36 are described herein as illustrative examples. If desired, SAR ADC 36 and the components therein may generally implement any type of successive approximation or search configuration including a non-binary-based (i.e., non-radix-2) search or approximation configuration such as a sub-2 radix (sometimes referred to as a sub-radix-2) approximation to perform an analog-to-digital conversion.

While not explicitly shown in the example of FIG. 3, ADC 36 may also include other components or circuitry such as clock circuitry, timing control circuitry supplying timing control signals to one or more of DAC 40, comparator 42, one or more auto-zero switches coupled between input and output terminals of comparator 42, SAR control logic 44, switches, and/or other components of ADC 36, and/or other circuitry that support the analog-to-digital conversion operation performed by ADC 36.

DAC 40 (sometimes referred to herein as DAC circuitry 40) may include a portion that serves as a sampling and holding circuit for input signal Vin. In particular, an input terminal of ADC 36 that receives signal Vin may be coupled to DAC 40, or more specifically the sample and hold portion of DAC 40, via switch 46. Switch 46 may be activated, or placed in a conductive state, using control signal Vsamp to sample the voltage of signal Vin onto DAC 40 and may be deactivated, or placed in a non-conductive state, using control signal Vsamp to hold the sampled voltage of signal Vin at DAC 40.

DAC 40 may hold, thereby store, the sampled voltage for signal Vin and use the sampled voltage to generate one or more output voltages Vdac on path 48 for the binary-based or non-binary-based search operation. Path 48 may be coupled to a first terminal of comparator 42 such as the inverting terminal of comparator 42 in the example of FIG. 3. To generate the one or more output voltages Vdac based on the voltage of input signal Vin, DAC 40 may receive and use one or more reference voltages VREF such as a first reference voltage and a second reference voltage less than the first reference voltage and one or more control signals from SAR control logic circuitry 44. A reference voltage terminal supplying a reference voltage VCM such as a common mode voltage may be coupled to a second voltage terminal of comparator 42 such as the non-inverting terminal of comparator 42 in the example of FIG. 3. If desired, reference voltage VCM may be the same as a low reference voltage received by DAC 40.

Voltages Vdac generated based on the same sampled voltage of input signal Vin may be sequentially compared to reference voltage VCM such as a reference ground voltage or an offset voltage using comparator 42. Each of the voltages Vdac may be sequentially varied, thereby allowing successive approximations to be compared to reference voltage VCM. Each comparison may further narrow the range of possible digital values of the sampled voltage of signal Vin, with the number of comparisons determining the bit resolution of the digital output of the analog-to-digital conversion.

In particular, comparator 42 may compare the magnitude of each voltage Vdac to the magnitude of voltage VCM. The output of comparator 42 may be a signal that is provided to SAR control logic 44 (sometimes referred to herein as SAR control logic circuitry 44 or control logic circuitry 44) using path 50 coupled between the output terminal of comparator 42 and control logic circuitry 44. The output signal of comparator 42 may have a value indicative of which of voltages Vdac or VCM is greater (or less). As an example, the comparator output signal may be driven to a logic high ('1') level if voltage Vdac is greater than voltage VCM and the comparator output signal may be driven to a logic low ('0') level if voltage Vdac is less than voltage signal VCM, or vice versa.

SAR control logic 44 in FIG. 3 may include digital logic circuitry such as combinational logic circuitry such as one or more Boolean logic circuits, sequential logic circuitry such as one or more latches or registers, and/or any other suitable components for operating ADC 36 in the desired manner. In particular, control logic circuitry 44 may track the results of comparisons by comparator 42 and update the control signals provided along paths 52 to DAC 44. The updated control signals received by DAC 40 along path 52 may adjust voltage Vdac output by DAC 42 accordingly. Each comparison operation performed by comparator 42 (based on a corresponding Vdac for the same sampled input voltage) may resolve a single bit of the corresponding digital output for the sampled input voltage, starting with the most significant bit and ending with the least significant bit. After a suitable number of comparisons resolving a desired number of bits for the digital output of the analog-to-digital conversion operation, control logic circuitry 44 may output all of the resolved bits as the entire digital output Dout at an output terminal of ADC 36.

The configuration of ADC 36 in FIG. 3 is merely illustrative. If desired, ADC 36 may have other suitable configurations.

Figure 4:
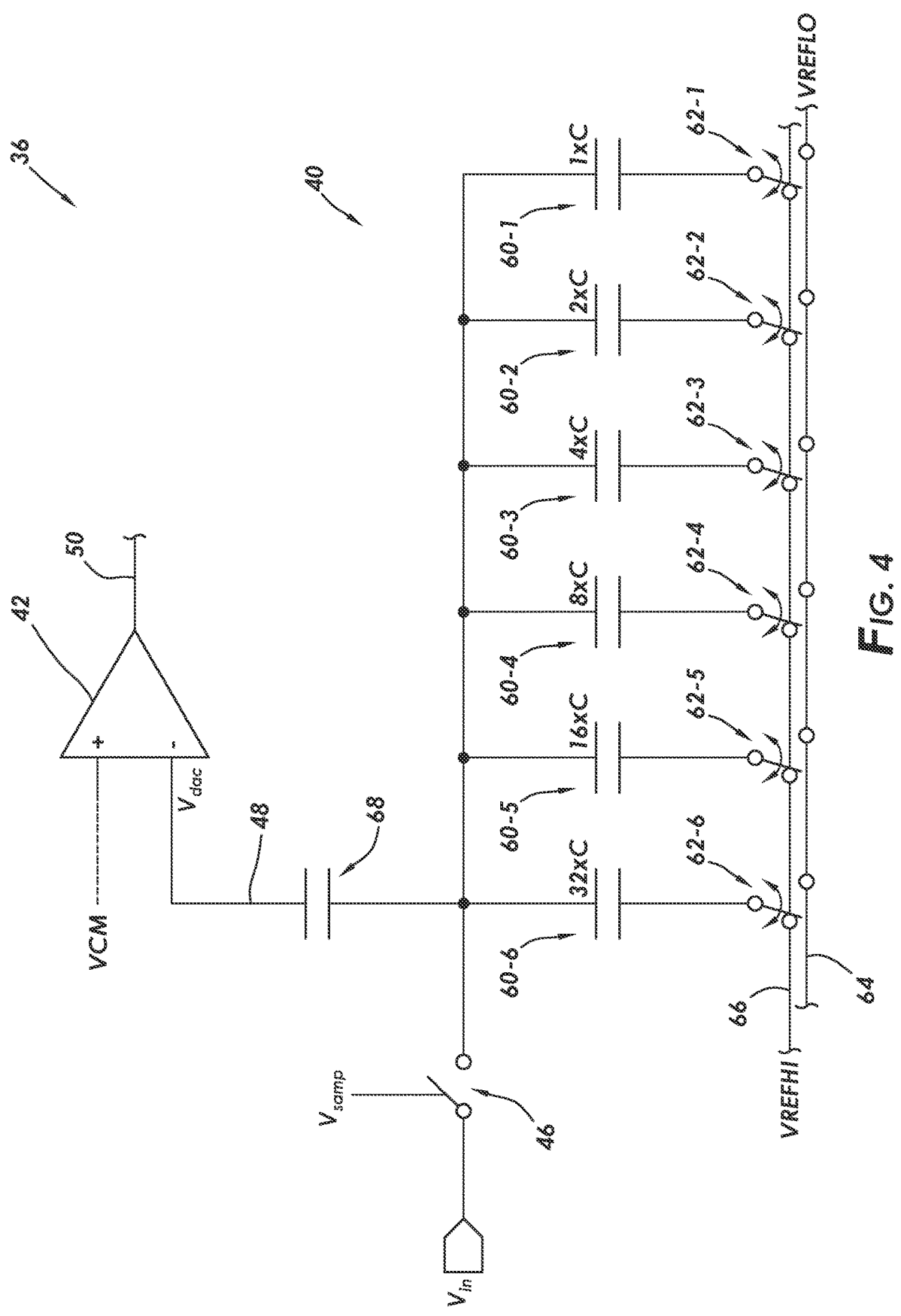
FIG. 4 is a diagram of illustrative capacitive digital-to-analog converter circuitry for analog-to-digital converter circuitry in accordance with some embodiments.

DAC 40 may be implemented using a capacitive DAC (CDAC) which includes one or more capacitor banks each containing a plurality of capacitors. An illustrative configuration of ADC 36 that includes capacitive DAC 40 is shown in the example of FIG. 4. As shown in FIG. 4, capacitive DAC 40 may include a plurality of capacitors 60. While six illustrative capacitors 60 are shown in the example of FIG. 4, this is merely illustrative. Capacitive DAC 40 may include any suitable number of capacitors depending on the desired bit resolution for the digital output of ADC 36. In particular, each capacitor may be used to resolve a given bit in the digital output of ADC 36. In such a manner, when a greater number of capacitors is provided, more bits can be resolved, thereby leading to a higher bit of the digital output.

In the example of FIG. 4, capacitor 60-1 may have a capacitance of 1*C or C, capacitor 60-2 may have a capacitance of 2*C (i.e., the capacitance of capacitor 60-1 multiplied by two), capacitor 60-3 may have a capacitance of 4*C (i.e., the capacitance of capacitor 60-1 multiplied by four), capacitor 60-4 may have a capacitance of 8*C (i.e., the capacitance of capacitor 60-1 multiplied by eight), capacitor 60-5 may have a capacitance of 16*C (i.e., the capacitance of capacitor 60-1 multiplied by sixteen), and capacitor 60-6 may have a capacitance of 32*C (i.e., the capacitance of capacitor 60-1 multiplied by thirty-two). In this 6-bit configuration, capacitor 60-6 may be to resolve the most significant bit of the digital output of ADC 36, capacitor 60-5 may be to resolve the second most significant bit of the digital output of ADC 36, capacitor 60-4 may be to resolve the third most significant bit of the digital output of ADC 36, and so on. Capacitor 60-1 may be used to resolve the least significant bit of the digital output of ADC 36.

The example of FIG. 4 in which capacitors 60 in CDAC 40 are implemented with binary scaling capacitances (e.g., 1*C, 2*C, 4*C, etc.) is merely illustrative. If desired, capacitors 60 may have non-binary scaling capacitances such as capacitances that support a sub-2 radix approximation scheme. As one illustrative example, CDAC 40 may have one or more capacitors 60 respectively having capacitances 1.1*C, 1.2*C, 1.4*C, 1.9*C. 3.6*C, 6.9*C, and/or 13 C to support a sub-2 radix approximation scheme.

Each of capacitors 60 may have a commonly-connected first terminal at the top plate and may have a second terminal at the bottom plate independently connected to a first voltage supply terminal such as voltage supply terminal 66 supplying reference voltage VREFHI or a second voltage supply terminal such as voltage supply terminal 64 supplying reference voltage VREFLO. If desired, the second terminal of each capacitor 60 may also exhibit a third state in which it is disconnected from both voltage supply terminals. In configurations in which additional voltage supply terminal(s) supplying other reference voltage(s) are provided, the second terminal of each capacitor may be coupled to the additional supply terminal(s).

In particular, switching circuitry 62-1, 62-2, 62-3, 62-4, 62-5, and 62-6 may each include one or more switches that couple the second terminal of the corresponding capacitor 60 to terminal 66 or terminal 64 and/or that decouple the second terminal of the corresponding capacitor 60 from both terminals 64 and 66. SAR control logic circuitry 44 may supply a corresponding control signal, along a corresponding path 52 (FIG. 3), to each switch in switching circuitry 62-1, 62-2, 62-3, 62-4, 62-5, and 62-6. The adjustment of these control signals may adjust the output voltage Vdac of DAC 40 to perform the binary search operation in resolving each bit of the digital output.

As shown in FIG. 4, the common terminal of capacitors 60 (at their top plates) may be coupled to the inverting terminal of comparator 42 via a coupling capacitor 68. The input terminal of ADC 40 that receives the analog signal for analog-to-digital conversion may be coupled to the common terminal between capacitor 68 and each capacitor 60 via switch 46.

The input voltage Vin may be sampled, using switch 46, onto the common terminal of capacitors 60 between coupling capacitor 68 and capacitors 60. After sampling, ADC 36 may perform the binary search operation in a bit-wise manner to generate the digital output Dout for the input voltage Vin. The binary search operation may include multiple iterations of toggling the switches in switching circuitry 62 and comparing the varied DAC output voltage Vdac to reference voltage VCM.

In some illustrative configurations described herein as an example, image sensor 16 may perform correlated multi-sampling (CMS) for image data being read out from each pixel 22. Performing correlated multi-sampling may, for example, reduce undesired artifacts resulting from noise such as random telegraph signal (RTS) noise. However, performing correlated multi-sampling can often require that the same image signal (output from a particular pixel or a set of pixels) be sampled and read out periodically in the time domain and subsequently processed by readout circuitry 28 multiple times. This may undesirably reduce frame rate when the CMS operation is performed in the digital domain since additional ADC conversions are required to convert each sample of the same image signal.

Accordingly, it may be desirable to provide correlated multi-sampling circuitry for image sensor 16 while maintaining a high frame rate, minimizing row time, reducing power consumption, and maintaining and/or improving other performance metrics.

Figure 5:
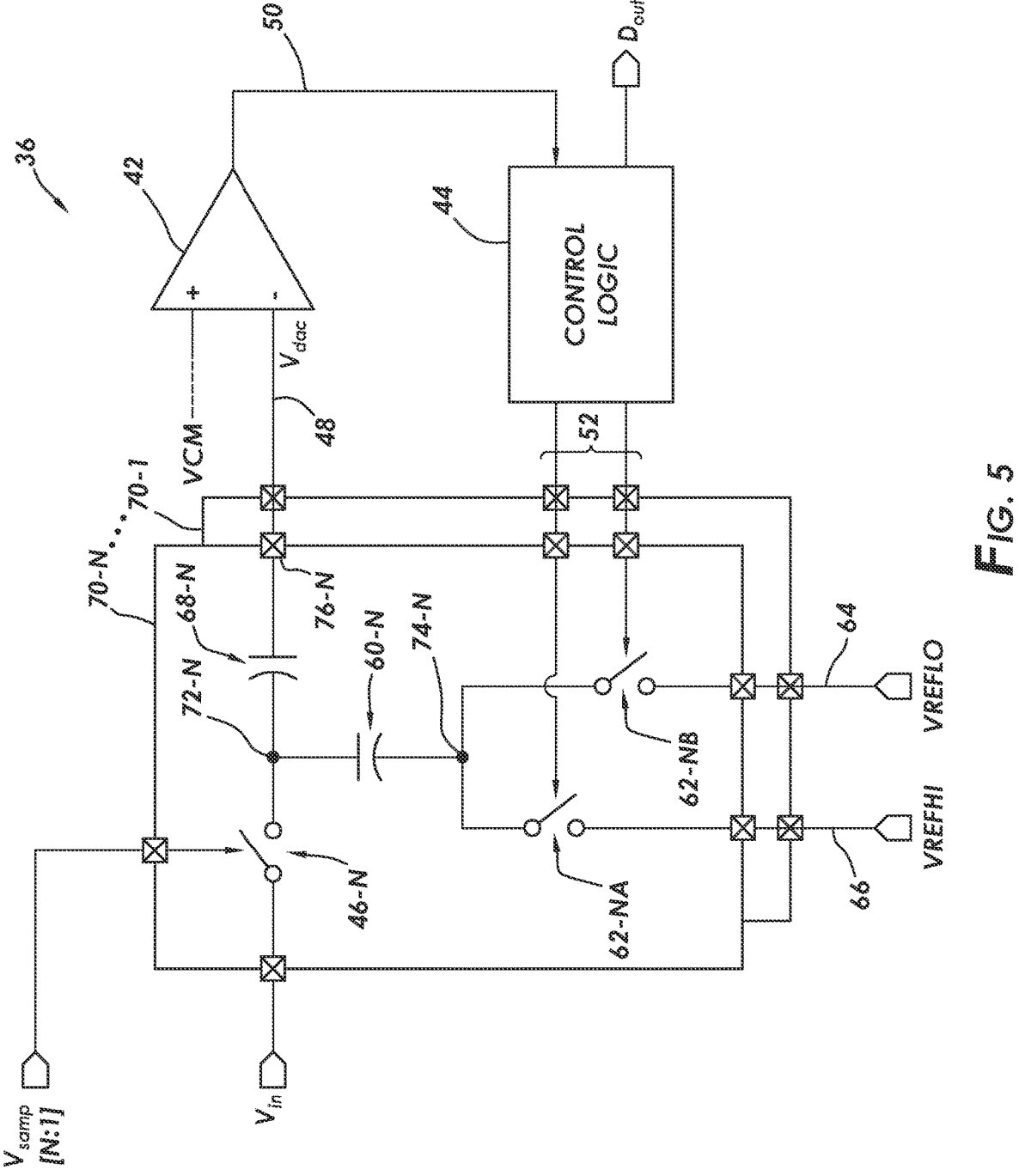
FIG. 5 is a diagram of illustrative analog-to-digital converter circuitry configured to perform correlated multi-sampling in accordance with some embodiments.

FIG. 5 shows an illustrative implementation of ADC 36 configured to perform correlated multi-sampling of an input analog signal such as a pixel output signal from pixel 22 (FIG. 2). ADC 36 in FIG. 5 may include comparator 42, control logic circuitry 44, supply voltage terminals 64 and 66, paths 48, 50, and 52, input terminal of ADC 36 receiving input signal Vin, output terminal of ADC 36 outputting digital output Dout, and other elements previously described in connection with FIGS. 3 and 4. These previously described elements may serve the same functions and/or may be configured in the same manner as described in connection with FIGS. 3 and 4.

Additionally, ADC 36 may include multiple circuit portions 70 (sometimes referred to herein as slices 70) each coupled to the same input terminal of ADC 36 at which input signal Vin is received. These multiple circuit portions 70 may collectively form the correlated multi-sampling circuitry for ADC 36. In particular, the correlated multi-exampling circuitry may be integrated with the capacitive DAC circuitry of ADC 36.

While N number of circuit portions 70-1 . . . 70-N are shown in the example of FIG. 5, any suitable number of circuit portions 70 may be included within ADC 36. The number of circuit portions 70 may be equal to the desired number of samples, to be taken over time, of the same input signal. In other words, for an N-sample CMS operation, N circuit portions 70 may be provided in ADC 36.

The same elements may be included in each circuit portion 70. The illustrative configuration of circuit portion 70-N is shown in FIG. 5 and explicitly described herein. Other circuit portions 70-(N-1), 70-(N-2), . . . 70-1 may each have the same elements as described in connection with circuit portion 70-N, unless otherwise described herein.

As shown in FIG. 5, circuit portion 70-N may include a sampling switch 46-N coupling the input terminal of ADC 36 to terminal 72-N. Each of circuit portions 70-N, 70-(N-1), . . . 70-1 may include an independently controllable sampling switch 46. In other words, switch 46-N of circuit portion 70-N may receive control signal Vsamp[N], switch 46-(N-1) of circuit portion 70-(N-1) may receive control signal Vsamp[N-1] . . . , switch 46-1 of circuit portion 70-1 may receive control signal Vsamp[1].

Circuit portion 70-N may include a coupling capacitor 68-N that couples terminal 72-N to terminal 76-N. Each of circuit portions 70-N, 70-(N-1), . . . 70-1 may include a different (instance of) coupling capacitor 68. To maintain uniformity across circuit portions 70-N, 70-(N-1) . . . 70-1, the different coupling capacitors 68 may be configured to have the same capacitance. If desired, one or more coupling capacitors may have a capacitance that differs from the capacitance of one or more other coupling capacitors. The circuit portion output terminal 76 may be a common or shared terminal. In other words, terminals 76-N, 76-(N-1) . . . 76-1 may be electrically connected or shorted to each other. This common terminal 76 may be coupled to the inverting terminal of comparator 42 via path 48.

Circuit portion 70-N may include a sampling capacitor 60-N that couples terminal 72-N to terminal 74-N. Each of circuit portions 70-N. 70-(N-1), . . . 70-1 may include a different (instance of) sampling capacitor 60. To maintain uniformity across circuit portions 70-N, 70-(N-1) . . . 70-1, the different sampling capacitors 60 may be configured to have the same capacitance. If desired, one or more sampling capacitors may have a capacitance that differs from the capacitance of one or more other sampling capacitors.

Sampling capacitors 60-N, 60-(N-1), . . . 60-1 for performing CMS may be implemented using the same capacitors that form the capacitor bank(s) of DAC 40 such as capacitors 60 in FIG. 4. Sampling capacitors 60-N, 60-(N-1), . . . 60-1 may each store a corresponding sample (sampled voltage) of the same input signal during the sampling operation of ADC 36. In particular, terminals 72-N, 72-(N-1) . . . 72-1 may store the N different samples of the same input signal taken at different times. A charge-sharing CMS operation may occur across terminals 72-N, 72-(N-1), . . . 72-1, e.g., via capacitive coupling to the common output terminal 76.

Sampling capacitors 60-N, 60-(N-1), . . . 60-1 may subsequently be used to perform the binary search operation as part of the capacitive DAC circuitry of ADC 36. Accordingly, switching circuitry 62 containing one or more switches may couple each sampling capacitor 60 to voltage supply terminal 64 or voltage supply terminal 66, or decouple each sampling capacitor 60 from both voltage supply terminals, in the manner described in connection with FIG. 4 to perform the binary search operation.

As an example in connection with circuit portion 70-N, terminal 74-N may be coupled to voltage supply terminal 66 supplying reference voltage VREFHI via switch 62-NA and may be coupled to voltage supply terminal 64 supplying reference voltage VREFLO via switch 62-NB. Switching circuitry 62 containing switches 62-NA and 62NB may be controlled by control signals received from control logic circuitry 44 over paths 52. The control signal received by switch 62-NA may be an inverted version of the control signal received by switch 62-NA such that at most only one of voltage terminals 64 and 66 is connected to capacitor 60-N. Each of circuit portions 70-N. 70-(N-1), . . . 70-1 may include different (instances of) switching circuitry 62 coupling a corresponding sampling capacitor 60 to terminals 64 and 66. Switching circuitry 62 of each circuit portion 70 may include two switches that receive corresponding control signals from control logic circuitry 44 over paths 52, as an example. If desired, any suitable number of switches may be used to perform the switching functions of switching circuitry 62.

The states of switching circuitry 62 of each circuit portion 70 may be toggled during the binary search operation, which occurs after the correlated multi-sampling of the same input analog signal, to generate different DAC output voltages Vdac for comparison at comparator 42. The result of each comparison output by comparator 42 along path 50 is used to inform the states of switching circuitry 62 of each circuit portion 70 for generating a subsequent value of voltage Vdac for a subsequent comparison at comparator 42.

Configured in the manner described in connection with FIG. 5, correlated multi-sampling (CMS) circuitry may be integrated into ADC 36. In particular, the CMS circuitry may be integrated into the capacitive DAC circuitry without affecting the binary search operation. Additionally, ADC 36 can utilize charge sharing to perform the CMS operation, which eliminates the need to perform a separate ADC conversion operation for each of the samples, thereby reducing readout time or row time, improving frame rate, and reducing power consumption. Moreover, the CMS operation performed by ADC 36 may mitigate noise artifacts attributable to any noise sources preceding the capacitive DAC circuitry in ADC 36 such as those attributable to preceding amplifier and/or buffer circuits.

Figure 6:
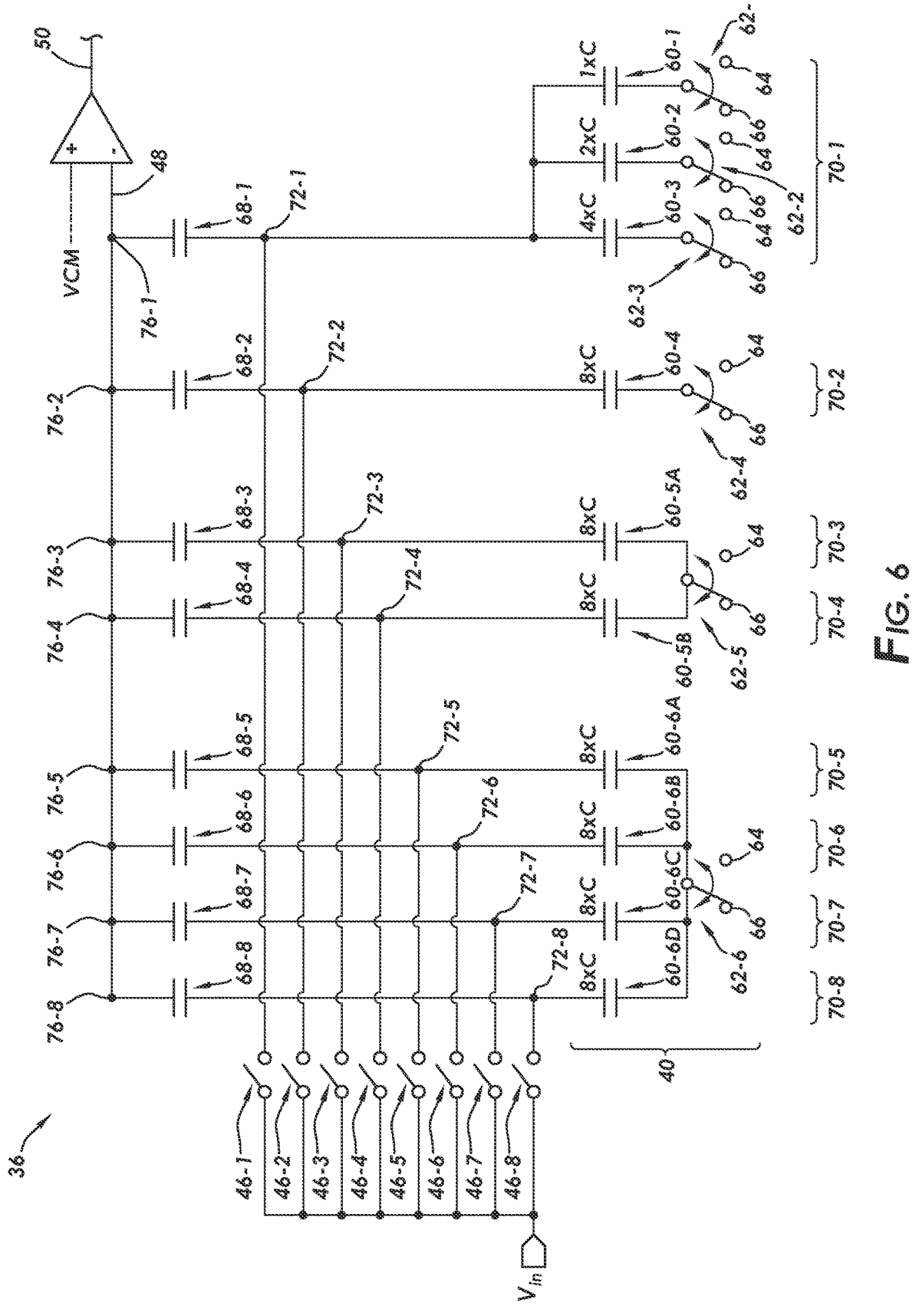
FIG. 6 is a diagram of illustrative correlated multi-sampling circuitry integrated with capacitive digital-to-analog converter circuitry in accordance with some embodiments.

FIG. 6 is a diagram of eight illustrative circuit portions 70 (sometimes referred to as 8-sample CMS circuitry) that are integrated into the capacitive DAC circuitry of a 6-bit SAR ADC 36. The illustrative circuit portions 70-8, 70-7 . . . 70-1 shown in FIG. 6 may be implemented as circuit portions 70-N . . . 70-1 in FIG. 5.

As shown in FIG. 6, capacitive DAC circuitry 40 may include a plurality of capacitors 60, which also serves as the sampling capacitors for the CMS circuitry. Whereas capacitors for DAC circuitry 40 may desirably have vastly different capacitances (e.g., in the manner described in FIG. 4), it may be desired for sampling capacitors of different circuit portions 70 of the CMS circuitry to have a more uniform distribution of capacitances. Accordingly, some of capacitors 60 in DAC circuitry 40 may be used in combination to implement a sampling capacitor for a given circuit portion 70 of the CMS circuitry, while one or more of the capacitors 60 in DAC circuitry 40 may be split, or implemented as multiple parallel capacitors, to implement multiple sampling capacitors for multiple circuit portions 70 of the CMS circuitry.

In the example of FIG. 6, circuit portion 70-1 of the CMS circuitry may include a sampling capacitor formed using multiple capacitors of DAC circuitry 40 such as capacitor 60-1 having capacitance 1*C, capacitor 60-2 having capacitance 2*C, and capacitor 60-3 having capacitance 4*C. Accordingly, the effective or combined capacitance of the sampling capacitor for circuit portion 70-1 of the CMS circuitry may be 7*C. Circuit portion 70-2 of the CMS circuitry may include a sampling capacitor formed using a single capacitor of DAC circuitry 40 such as capacitor 60-4 having capacitance 8*C.

In the example of FIG. 6, the illustrative capacitor 60-5 having capacitance 16*C described in connection with FIG. 4 may be split into capacitors 60-5A and 60-5B coupled in parallel each having capacitance 8*C. Circuit portion 70-3 of the CMS circuitry may include a sampling capacitor formed using a single split capacitor of DAC circuitry 40 such as capacitor 60-5A having capacitance 8*C. Circuit portion 70-4 of the CMS circuitry may include a sampling capacitor formed using a single split capacitor of DAC circuitry 40 such as capacitor 60-5B having capacitance 8*C.

In the example of FIG. 6, the illustrative capacitor 60-6 having capacitance 32*C described in connection with FIG. 4 may be split into capacitors 60-5A, 60-6B, 60-6C, and 60-6D coupled in parallel each having capacitance 8*C. Circuit portion 70-5 of the CMS circuitry may include a sampling capacitor formed using a single split capacitor of DAC circuitry 40 such as capacitor 60-6A having capacitance 8*C. Circuit portion 70-6 of the CMS circuitry may include a sampling capacitor formed using a single split capacitor of DAC circuitry 40 such as capacitor 60-6B having capacitance 8*C. Circuit portion 70-7 of the CMS circuitry may include a sampling capacitor formed using a single split capacitor of DAC circuitry 40 such as capacitor 60-6C having capacitance 8*C. Circuit portion 70-8 of the CMS circuitry may include a sampling capacitor formed using a single split capacitor of DAC circuitry 40 such as capacitor 60-6D having capacitance 8*C.

Configured in this manner (e.g., by splitting and/or combining capacitors), capacitors in DAC circuitry 40 may more effectively form sampling capacitors for the CMS circuitry. In the example of FIG. 6, the relative weights applied to each sample of the input analog signal for circuit portions 70-8, 70-7, 70-6, 70-5, 70-4, 70-3, 70-2, and 70-1 are 8, 8, 8, 8, 8, 8, 8, and 7, respectively. If desired, other suitable weights may be applied to one or more of the samples. In particular, a more non-uniform set of weights or an exactly uniform set of weights may be used by including other sampling capacitors for the CMS circuitry not part of DAC circuitry 40 and/or by not using one or more capacitors of DAC circuitry 40.

While the capacitor scaling configuration shown in FIG. 6 more closely resembles a binary capacitance scaling scheme (e.g., corresponding to the capacitance scaling shown in example of FIG. 4), this is merely illustrative. In general, the capacitance scaling configuration of capacitors 60 in FIG. 6 and the corresponding split capacitances may be adjusted as desired to implement any suitable capacitance scaling schemes such as a capacitance scaling scheme that support sub-2 radix approximation operations or generally other non-binary-based approximation operations.

Sampling switch 46-8 may be controlled by control signal Vsamp[8] to sample an input voltage for a pixel output signal at a first time onto terminal 72-8. Sampling switch 46-7 may be controlled by control signal Vsamp[7] to sample an input voltage for the same pixel output signal at a second time onto terminal 72-7. Sampling switch 46-6 may be controlled by control signal Vsamp[6] to sample an input voltage for the same pixel output signal at a third time onto terminal 72-6. Sampling switch 46-5 may be controlled by control signal Vsamp[5] to sample an input voltage for the same pixel output signal at a fourth time onto terminal 72-5. Sampling switch 46-4 may be controlled by control signal Vsamp[4] to sample an input voltage for the same pixel output signal at a fifth time onto terminal 72-4. Sampling switch 46-3 may be controlled by control signal Vsamp[3] to sample an input voltage for the same pixel output signal at a sixth time onto terminal 72-3. Sampling switch 46-2 may be controlled by control signal Vsamp[2] to sample an input voltage for the same pixel output signal at a seventh time onto terminal 72-2. Sampling switch 46-1 may be controlled by control signal Vsamp[1] to sample an input voltage for the same pixel output signal at an eighth time onto terminal 72-1. Samples of the same input signal taken at different times may capture temporal variations such as those caused by noise and/or attributable to undesired artifacts. The charge-sharing CMS operation performed at ADC 36 with these eight samples may reduce the effects of these temporal variations.

Figure 7:
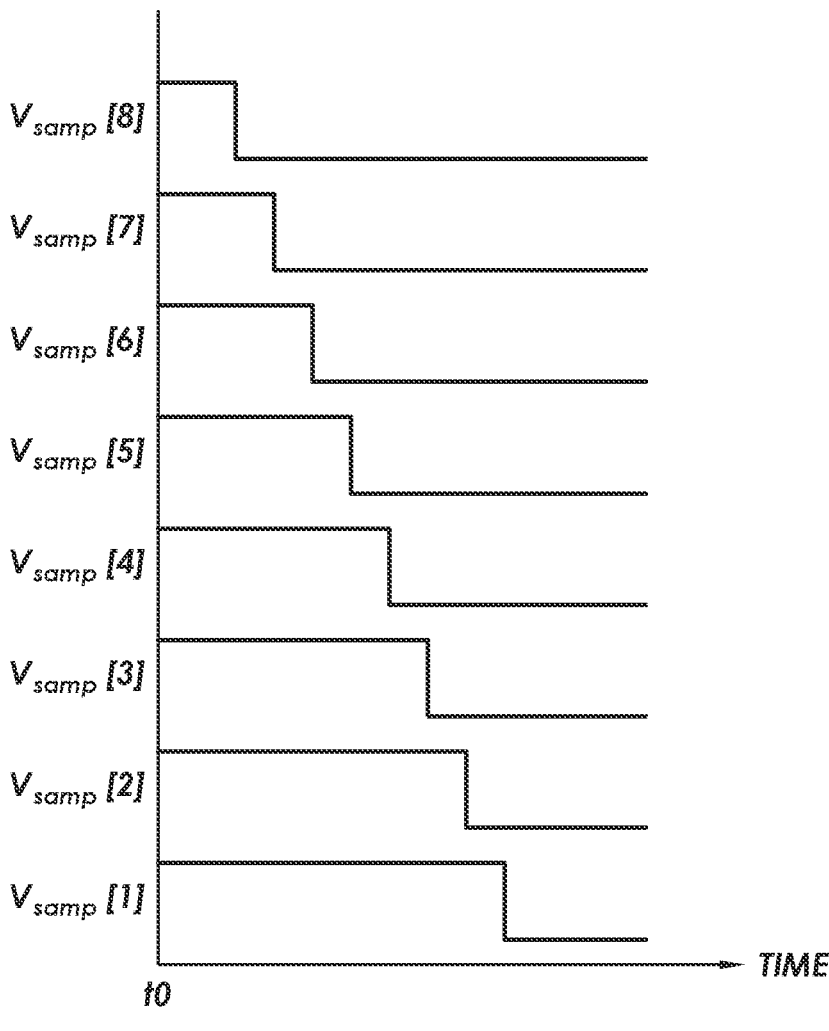
FIG. 7 is an illustrative timing diagram for sampling an input signal for correlated multi-sampling in accordance with some embodiments.

FIG. 7 is an illustrative timing diagram showing how control signals Vsamp[8], Vsamp[7], Vsamp[6], Vsamp[5], Vsamp[4], Vsamp[3], Vsamp[2], and Vsamp[1] may be sequentially de-asserted to sample the same pixel output signal at different times. In particular, in the example of FIG. 7, the corresponding switches 46 controlled by the control signals may all be activated at time t0 to electrically connect the same input terminal of ADC 36 to the respective terminals 72. At a falling edge of each control signal, the corresponding switch 46 controlled by that control signal may be deactivated, thereby resulting in a sample being held or stored at the disconnected terminal 72. In such a manner, ADC 36 may obtain multiple samples of the same input analog signal.

After the de-assertion of the last control signal Vsamp[1], ADC 36 may perform the binary search operation to iteratively resolve each bit of the digital output corresponding to the input analog signal. Referring back to FIG. 6, switching circuitry 62-6, 62-5, 62-4, 62-3, 62-2, and 62-1 may be selectively controlled using control signals from control logic 44 to connect to connect capacitors 60-6, 60-5, 60-4, 60-3, 60-2, and 60-1 to voltage terminal 64 or voltage terminal 64 to perform the binary search operation in the manner described in connection with FIGS. 4 and 6.

Various embodiments have been described illustrating ADC circuitry and an imaging system containing ADC circuitry.

As a first example, an image sensor may include an array of image sensor pixels and pixel readout circuitry coupled to the array of image sensor pixels. The pixel readout circuitry may include a successive approximation register analog-to-digital converter (SAR ADC). The SAR ADC may include correlated multi-sampling (CMS) circuitry. The SAR ADC may include a capacitive digital-to-analog converter (CDAC). The CMS circuitry may include a plurality of sampling switches coupling an input terminal of the SAR ADC to the CDAC. The CDAC may include a plurality of capacitors. Each sampling switch in the plurality of sampling switches may couple the input terminal of the SAR ADC to at least one capacitor in the plurality of capacitors.

In some illustrative configuration described herein, the SAR ADC may include, in addition to the CDAC having a capacitor bank, a comparator coupled to the DAC, and control logic circuitry coupled to the DAC. The CMS circuitry may be formed at least in part using the capacitor bank of the DAC. The CMS circuitry may include a plurality of coupling capacitors that couple the capacitor bank to the comparator. The CMS circuitry may include a plurality of sampling switches coupling an input terminal of the SAR ADC to the capacitor bank. The plurality of coupling capacitors may be coupled to a first input terminal of the comparator and a voltage terminal supplying a reference voltage may be coupled to a second input terminal of the comparator. The digital-to-analog converter may include switching circuitry coupling the capacitor bank to a first voltage terminal supplying a first reference voltage and to a second voltage terminal supplying a second reference voltage. The control logic circuitry may be configured to provide control signals to the switching circuitry. The control logic circuitry may be coupled to an output terminal of the comparator and may be configured to generate the control signals based on a comparator output signal on the output terminal of the comparator. The control logic circuitry may be configured to generate a digital output at the output terminal of the SAR ADC.

As a second example, an analog-to-digital converter (ADC) may have an input terminal that receives an analog signal for analog-to-digital conversion. The ADC may include a capacitive digital-to-analog converter (CDAC), a comparator coupled to the CDAC, control logic circuitry coupled to the comparator and the CDAC, and a plurality of sampling switches each coupling the CDAC to the input terminal of the ADC. The capacitive digital-to-analog converter may include a capacitor bank having a plurality of capacitors. Each sampling switch in the plurality of sampling switches may be coupled to at least one capacitor in the plurality of capacitors. The capacitive digital-to-analog converter may include switching circuitry coupling the capacitor bank to a first voltage terminal supplying a first reference voltage and a second voltage terminal supplying a second reference voltage. Each sampling switch in the plurality of sampling switches is coupled to an input terminal of the comparator via a corresponding coupling capacitor. The coupling capacitors coupling the plurality of sampling switches to the input terminal of the comparator may have a same capacitance. The input terminal of the comparator may be an inverting terminal of the comparator and a non-inverting terminal of the comparator may be coupled to a voltage terminal supplying a reference voltage.

As a third example, a successive approximation register analog-to-digital converter (SAR ADC) may include a capacitive digital-to-analog converter (CDAC), a comparator coupled to the CDAC, control logic circuitry coupled to the comparator and the CDAC, and a plurality of coupling capacitors each coupling the CDAC to an input terminal of the comparator. The CDAC may include a capacitor bank that has first and second capacitors having a same capacitance. A first coupling capacitor in the plurality of coupling capacitors may be coupled to the first capacitor. A second coupling capacitor in the plurality of coupling capacitors may be coupled to the second capacitor. The SAR ADC may further include a plurality of sampling switches each coupling an input terminal of the SAR ADC to a corresponding coupling capacitor in the plurality of coupling capacitors. A first sampling switch in the plurality of sampling switches may be coupled to the first capacitor. A second sampling switch in the plurality of sampling switches may be coupled to the second capacitor.

It will be recognized by one skilled in the art that the present exemplary embodiments may be practiced without some or all of these specific details. In other instances, well-known operations have not been described in detail in order not to unnecessarily obscure the present embodiments.

The foregoing is merely illustrative and various modifications can be made to the described embodiments. The foregoing embodiments may be implemented individually or in any combination.

What is claimed is:

1. An image sensor comprising:
   an array of image sensor pixels; and
   pixel readout circuitry coupled to the array of image sensor pixels, wherein the pixel readout circuitry comprises a successive approximation register analog-to-digital converter, wherein the successive approximation register analog-to-digital converter comprises correlated multi-sampling circuitry, wherein the correlated multi-sampling circuitry is configured to sample an input analog signal multiple times to obtain multiple samples of the input analog signal, and wherein the successive approximation register analog-to-digital converter is configured to provide a digital output based on the multiple samples of the input analog signal.

2. The image sensor of claim 1, wherein the successive approximation register analog-to-digital converter comprises a capacitive digital-to-analog converter and the correlated multi-sampling circuitry comprises a plurality of sampling switches coupling an input terminal of the successive approximation register analog-to-digital converter to the capacitive digital-to-analog-converter.

3. The image sensor of claim 2, wherein the capacitive digital-to-analog converter comprises a plurality of capacitors and wherein each sampling switch in the plurality of sampling switches couples the input terminal of the successive approximation register analog-to-digital converter to at least one capacitor in the plurality of capacitors.

4. The image sensor of claim 1, wherein the successive approximation register analog-to-digital converter comprises a digital-to-analog converter having a capacitor bank, a comparator coupled to the digital-to-analog converter, and control logic circuitry coupled to the digital-to-analog converter and wherein the correlated multi-sampling circuitry is formed at least in part using the capacitor bank of the digital-to-analog converter.

5. The image sensor of claim 4, wherein the correlated multi-sampling circuitry comprises a plurality of coupling capacitors that couple the capacitor bank to the comparator.

6. The image sensor of claim 5, wherein the correlated multi-sampling circuitry comprises a plurality of sampling switches coupling an input terminal of the successive approximation register analog-to-digital converter to the capacitor bank.

7. The image sensor of claim 5, wherein the plurality of coupling capacitors are coupled to a first input terminal of the comparator and wherein a voltage terminal supplying a reference voltage is coupled to a second input terminal of the comparator.

8. The image sensor of claim 5, wherein the digital-to-analog converter comprises switching circuitry coupling the capacitor bank to a first voltage terminal supplying a first reference voltage and to a second voltage terminal supplying a second reference voltage and wherein the control logic circuitry is configured to provide control signals to the switching circuitry.

9. The image sensor of claim 8, wherein the control logic circuitry is coupled to an output terminal of the comparator and is configured to generate the control signals based on a comparator output signal on the output terminal of the comparator.

10. The image sensor of claim 9, wherein the control logic circuitry is configured to provide the digital output.

11. An analog-to-digital converter having an input terminal that receives an analog signal for conversion, the analog-to-digital converter comprising:
   a capacitive digital-to-analog converter;
   a comparator coupled to the capacitive digital-to-analog converter;
   control logic circuitry coupled to the comparator and the capacitive digital-to-analog converter; and
   a plurality of sampling switches each coupling the capacitive digital-to-analog converter to the input terminal, wherein the plurality of sampling switches are each configured to sample the analog signal at a different time to obtain a different sample of the analog signal and wherein the control logic circuitry is configured to provide a single digital output based on the samples of the analog signal obtained by the plurality of sampling switches.

12. The analog-to-digital converter of claim 11, wherein the capacitive digital-to-analog converter comprises a capacitor bank having a plurality of capacitors and wherein each sampling switch in the plurality of sampling switches is coupled to at least one capacitor in the plurality of capacitors.

13. The analog-to-digital converter of claim 12, wherein the capacitive digital-to-analog converter comprises switching circuitry coupling the capacitor bank to a first voltage terminal supplying a first reference voltage and a second voltage terminal supplying a second reference voltage.

14. The analog-to-digital converter of claim 11, wherein each sampling switch in the plurality of sampling switches is coupled to an input terminal of the comparator via a corresponding coupling capacitor.

15. The analog-to-digital converter of claim 14, wherein the coupling capacitors coupling the plurality of sampling switches to the input terminal of the comparator have a same capacitance.

16. The analog-to-digital converter of claim 15, wherein the input terminal of the comparator is an inverting terminal of the comparator and wherein a non-inverting terminal of the comparator is coupled to a voltage terminal supplying a reference voltage.

17. A successive approximation register analog-to-digital converter comprising:
   a capacitive digital-to-analog converter;
   a comparator coupled to the capacitive digital-to-analog converter;
   control logic circuitry coupled to the comparator and the capacitive digital-to-analog converter;
   a plurality of coupling capacitors each coupling the capacitive digital-to-analog converter to an input terminal of the comparator;
   a first sampling switch coupled to the input terminal of the comparator via a first coupling capacitor of the plurality of coupling capacitors, wherein the first sampling switch is activated during a time period for sampling an input analog signal; and
   a second sampling switch coupled to the input terminal of the comparator via a second coupling capacitor of the plurality of coupling capacitors, wherein the second sampling switch is activated during at least a portion of the time period for sampling the input analog signal.

18. The successive approximation register analog-to-digital converter of claim 17, wherein the capacitive digital-to-analog converter comprises a capacitor bank that has first and second additional capacitors having a same capacitance, wherein the first coupling capacitor is coupled to the first additional capacitor, and wherein the second coupling capacitor is coupled to the second additional capacitor.

19. The successive approximation register analog-to-digital converter of claim 18, wherein
   the first and second sampling switches are each coupled to an input terminal of the successive approximation register analog-to-digital converter.

20. The successive approximation register analog-to-digital converter of claim 17, wherein the control logic circuitry is configured to provide a single digital output based on a first sample of the input analog signal sampled using the first sampling switch and a second sample of the input analog signal sampled using the second sampling switch.

* * * * *